United States Patent [19]

Abramovich et al.

[11] Patent Number: 5,253,521
[45] Date of Patent: Oct. 19, 1993

[54] METHOD OF TRANSMITTING MEASURED TEMPERATURE AND POSITION PARAMETERS FROM A TRANSDUCER

[75] Inventors: Igor Abramovich; Neil McKenna, both of Simsbury, Conn.

[73] Assignee: Magnetek Inc., Clawson, Mich.

[21] Appl. No.: 966,364

[22] Filed: Oct. 26, 1992

[51] Int. Cl.⁵ .................... G01F 23/00; G01R 33/18
[52] U.S. Cl. ........................... 73/306; 73/292; 73/290 V; 324/207.21; 340/618; 374/142
[58] Field of Search ................. 73/292, 290 V, 306; 324/207.13, 207.21; 340/618; 374/142

[56] References Cited

U.S. PATENT DOCUMENTS

| | | | |
|---|---|---|---|
| 4,361,835 | 11/1982 | Nagy | 73/313 X |
| 4,726,226 | 2/1988 | Tellerman | 73/313 X |
| 4,924,700 | 5/1990 | Habart | 374/142 X |
| 5,017,867 | 5/1991 | Dumais et al. | 324/207.13 |
| 5,050,433 | 9/1991 | Lumetta | 73/313 |
| 5,076,100 | 12/1991 | Hunter et al. | 73/290 V |

Primary Examiner—Daniel M. Yasich
Attorney, Agent, or Firm—Krass & Young

[57] ABSTRACT

A magnetostrictive liquid level transducer equipped with a number of temperature sensitive resistors is supplied with low level power from a remote station and charges a capacitor to store power for interrogation of the level transducer. The transducer is interrogated periodically for level measurements and the capacitor is recharged between interrogations. During the recharging periods, temperature measurements are made. Thus the level and temperature related data is measured and transmitted alternately. Each measurement results in a pair of pulses having a spacing corresponding to the measured value. The transmission message comprises a plurality of frames or time periods. The first frame is blank and is used for synchronizing the receiving device with the message frames. The subsequent frames have the level and temperature related data interleaved in the message and are easily sorted by the receiving device at the remote station. The data pulses are sent on the power transmission conductors.

10 Claims, 3 Drawing Sheets

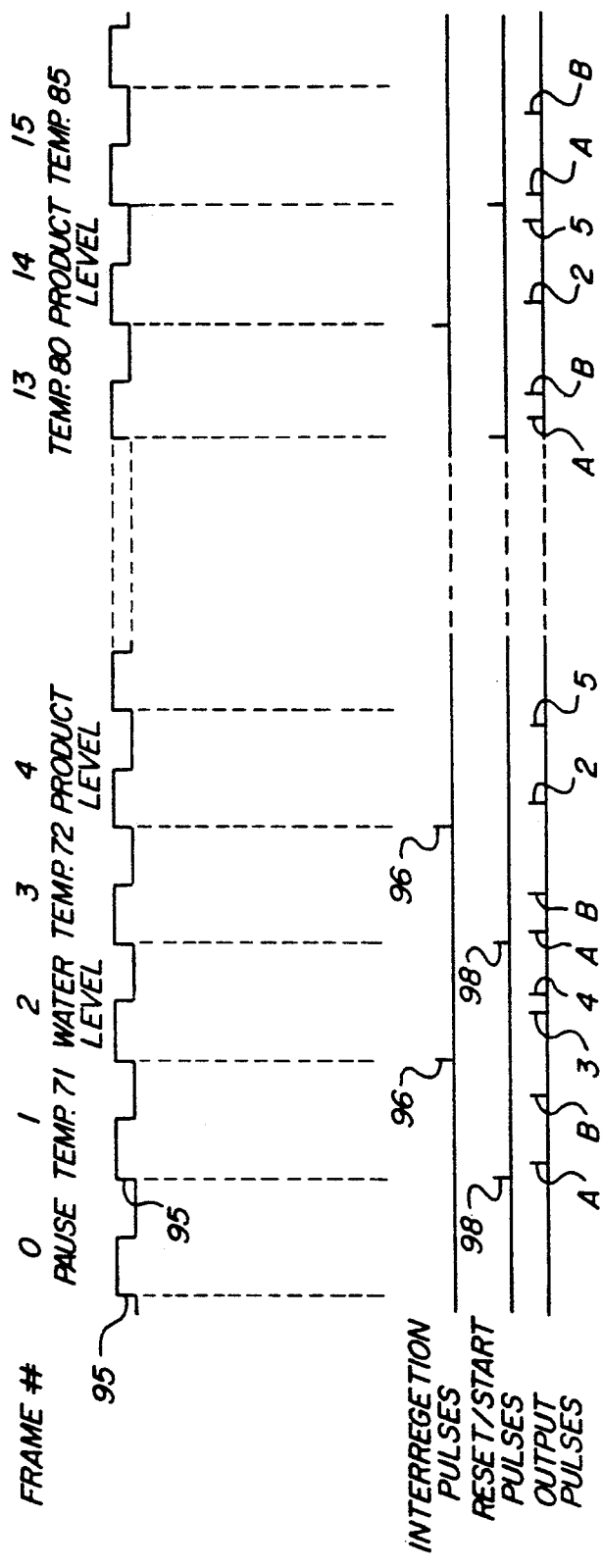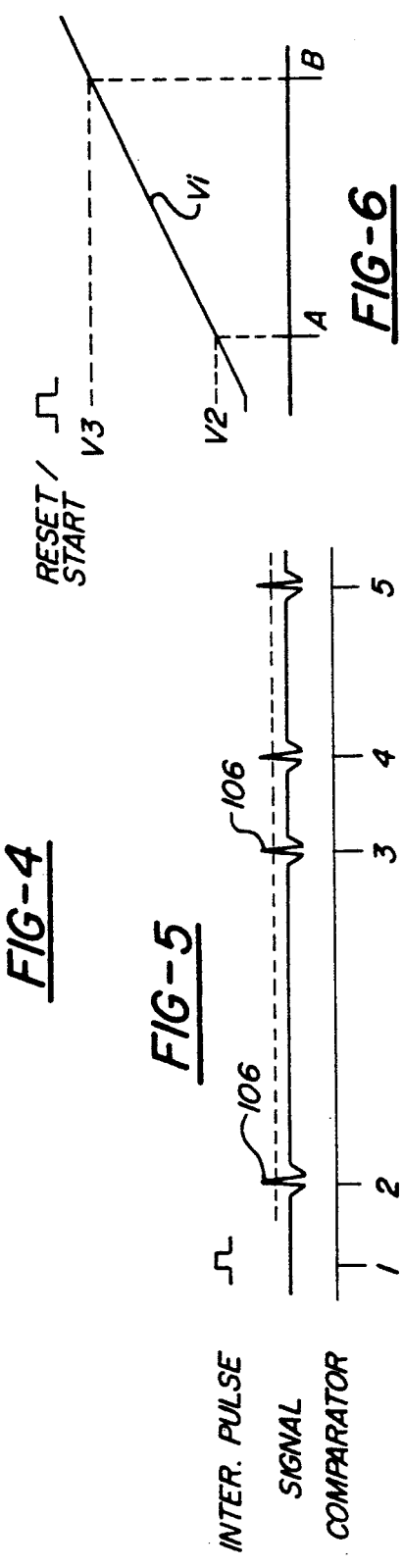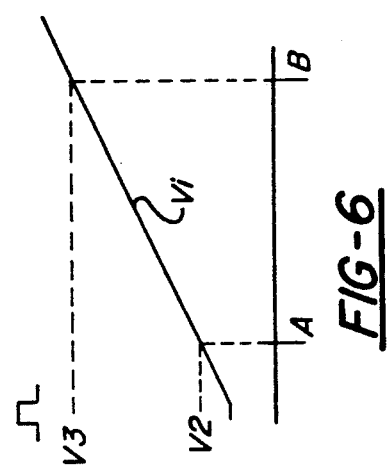

METHOD OF TRANSMITTING MEASURED TEMPERATURE AND POSITION PARAMETERS FROM A TRANSDUCER

FIELD OF THE INVENTION

This invention relates to data transmission of measurements made by a magnetostrictive position transducer and more particularly to data transmission from a combined position and temperature transducer.

BACKGROUND OF THE INVENTION

The usefulness of the phenomenon of magnetostriction in linear distance or position measuring devices is recognized by the prior art; for example, see Redding, U.S. Pat. No. 4,305,283; McCrea et al, U S. Pat. No. 4,158,964; Krisst, U.S. Pat. No. 4,071,818; Edwards, U.S. Pat. No. 4,028,619; and Tellerman, U.S. Pat. No. 3,898,555. A magnet near or around the magnetostrictive wire marks the location to be measured. Such devices can operate with either mechanical or electrical excitation. When an acoustical/mechanical strain propagating along the wire reaches the area of influence of the magnet an electrical signal is generated. Conversely, when an acoustical/mechanical strain propagating along the wire reaches the area of influence of the magnet an electrical signal is generated. Such linear position detectors are utilized as liquid level detectors. The position of the magnet, and hence the liquid level, is determined as a function of the time required for an acoustical/mechanical disturbance to propagate from one end of the wire through the area of influence of the magnet in the case of mechanical excitation or from the position of the magnet to a sensing apparatus located at one end of the wire in the case of electrical excitation.

An improvement on such devices is disclosed by Dumais U.S. Pat. No. 5,017,867 which includes a reflective termination at the foot of the magnetostrictive wire and measures the difference of the propagation times of a pulse from the magnet position to the foot of the wire and reflected back to the head of the device and of a pulse traveling directly from the magnet to the head. This technique provides twice as much resolution of each measurement since the reflected pulse travels twice as far as the direct pulse for each increment of magnet displacement.

In the field of liquid level detection, it is often useful to simultaneously measure liquid level and measure liquid temperature at one or more locations. Many liquids change volume with temperature. Thus a measurement based upon level alone would not distinguish between cases where the mass of liquid had changed and where the mass of liquid is the same but the volume has changed due to a temperature change. Tellerman, U.S. Pat. No. 4,726,226 has proposed a combined apparatus for simultaneously detecting liquid level using a magnetostrictive position detecting apparatus and detecting temperature at a plurality of positions within the liquid via temperature dependent resistors. Tellerman, U.S. Pat. No. 4,726,226, teaches an encoding technique for transmitting both position and temperature information to a remote site using a single pair transmission line. The resistances of the temperature dependent resistors are measured and these values are used to vary the period of a pulse generator. Position measurements are made at the varying pulse periods of the pulse generator. A composite signal is transmitted on the transmission line in the form of a series of pulses. The time between certain non-consecutive pulses is a measure of the liquid level. The time between groups of pulses corresponds to one of the temperature measurements. The sequence of temperature measurements is known to the apparatus receiving the signal via the transmission line, enabling the pulse period to be translated into temperature. Tellerman, U.S. Pat. No. 4.726,226, further teaches the use of two precision temperature independent resistors one having a resistance less than the range of the temperature dependent resistors and one having a resistance greater than this range. These fixed resistances provide fixed pulse periods enabling absolute calibration and correction for any component drift.

A similar system was proposed in U.S. Pat. No. 5,050,430 which differs from Tellerman, U.S. Pat. No. 4,726,226 in providing plural liquid level/temperature measurements in sequence. The combined apparatus produces a composite signal for transmission on a two wire transmission line including information regarding the linear displacement measured and the temperature measured by each temperature dependent resistor. The resistance of the temperature dependent resistors is measured in a predetermined sequence employing a sequential switching circuit. The resistance of a first reference resistor having a temperature independent resistance which is less than the lowest expected resistance of the temperature dependent resistors is first measured. Next, the resistance of a second reference resistor having a temperature independent resistance which is greater than the highest expected resistance of the temperature dependent resistors is measured. Then, the resistances of the temperature dependent resistors are measured in a predetermined sequence.

The major drawback of these techniques is that in both cases the time required to transmit the complete set of level and temperature data is rather long. Since usually a single secondary system controls up to 8 probes, and the system switches from one probe to another only after it has collected a certain number of level and temperature readings, it is highly desirable to minimize the time for reading each probe. The possibility of minimizing this time using each of the aforementioned approaches is limited due to different reasons.

When the first technique is used, the shortest temperature-encoded interval (corresponding to the lower end of the temperature range if RTD's or positive temperature coefficient thermistors are used as temperature sensors, or to the upper end if negative temperature coefficient thermistors are used) must be longer than the longest possible interrogation period. In order to provide for good resolution of the temperature measurements the longest temperature-encoded interval must be 2-3 times longer than the shortest interval.

An additional reason that the interval cannot be minimized is related to the following circumstance. Most of the liquid level probes are required to be intrinsically safe which means that the flow of energy into the probe is severely limited. On the other hand a noticeable momentary power is required to interrogate the magnetostrictive wire in order to achieve better accuracy, especially if a solid magnetostrictive wire is used. The only possible way to resolve this contradiction is to accumulate energy in a capacitor - a process that takes time. In practice, the minimum periodicity of level interrogation is about 9 milliseconds.

Another drawback is that the remote controller which receives data from the probe and a number of other probes must have a special logic circuit for each of the time intervals to be measured. Where there are two level measurements—one for water in a container and one for a liquid product above the water—and a temperature measurement, a counter in the controller must be turned on for the interval between the interrogation pulse and the first signal to measure product level, between the interrogation pulse and second signal to measure water level, and between two interrogation pulses to measure temperature related values.

Still another problem is that to synchronize into the serial signal sequence the controller must accumulate a significant number of measurements and analyze the data. In one commercial system a minimum of 128 measurements must be made. If a pulse is missed or added due to noise, etc., all this data will be lost and the process must be repeated.

SUMMARY OF THE INVENTION

According to the invention the data transmission is simplified, making it more efficient so that data is collected more quickly, less data is lost in case of noise, and the controller logic is also simplified. Using the new technique, the probe interleaves level and temperature "frames" or periods. After a level measurement, while the capacitor is being charged, the temperature measurement is performed. Such an approach cuts the overall measurement cycle time by a factor of two.

The probe logic provides for a continuous sequence of similar communication cycles. Each cycle consists of 16 frames. The first frame is empty—it carries no signals and serves for synchronization only. The other 15 frames carry two signal pulses each so that 30 pulses per cycle are transmitted. The interval between the pulses in each frame represents a value of the parameter permanently assigned to this frame. Thus the controller logic is very simple: it always enables the counter for a time interval between two consecutive pulses. Once the synchronizing frame is detected, very simple software in the controller sorts the received data. To test data integrity, the controller counts the total number of pulses between two synchronization pauses. If the number is different than 30, these 15 measurements must be discarded.

BRIEF DESCRIPTION OF THE DRAWINGS

The above and other advantages of the invention will become more apparent from the following description taken in conjunction with the accompanying drawings wherein like references refer to like parts and wherein:

FIG. 4 is a waveform diagram illustrating the data transmission scheme according to the invention;

FIG. 5 is a waveform diagram of level pulses developed by the detector of FIG. 1: and FIG. 6 is a waveform diagram illustrating the generation of output pulses spaced according to the value of temperature related resistors.

DESCRIPTION OF THE INVENTION

Figure 1:
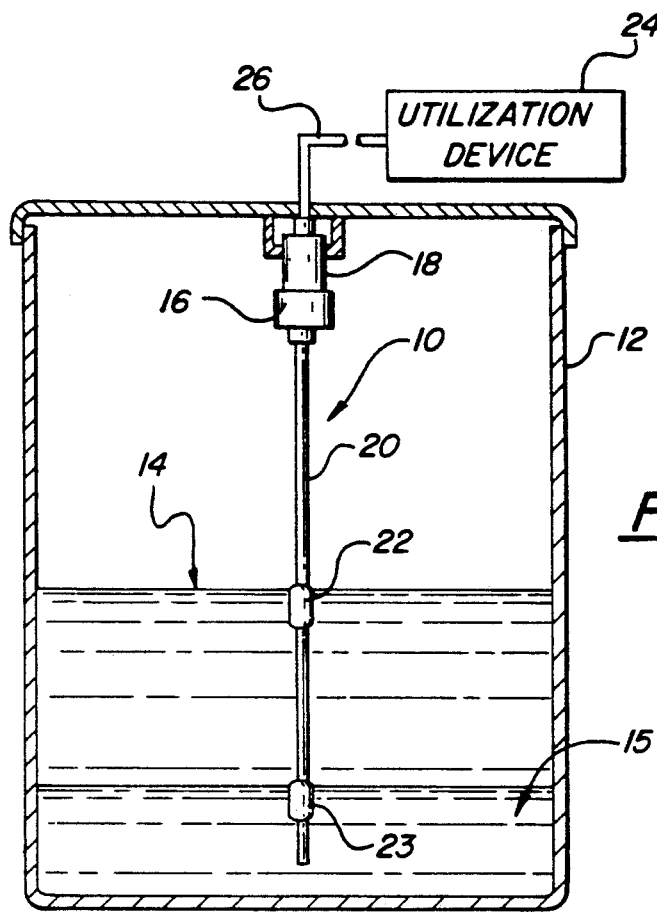
FIG. 1 is an elevational view of a liquid level detector for practicing the invention disposed in a tank shown in cross section.

Referring to FIG. 1 there is shown a combined magnetostrictive liquid level detection and plural location temperature detection device or probe 10 disposed in fixed relationship within a tank 12 for liquid 14 such as gasoline, herein called the product, the level of which may vary from empty to a full condition near the top of tank 12. In FIG. 1 tank 12 is slightly less than half full. A quantity of water 15 often resides in the bottom of the tank. The probe 10 comprises a head portion 16 having a fluid tight cap 18 which protects certain electronic components hereinafter described, a stainless steel tube 20 which extends vertically through tank 12 and through the liquid level measurement field which, in which case, is from a point near the bottom of tank 12 to a point close to but spaced approximately 8 to 12 inches from the top of tank 12; i.e., normal maximum liquid level is such that head 16 and cap 18 are not normally submerged. Mounted on tube 20 for sliding displacement therealong is a float 22 which contains circular or bar magnets for purposes hereinafter described and floats on the surface of the liquid 14, and a float 23, containing similar magnets, which floats at the interface of the liquid 14 and the water 15. The signal processing electronic components in head 16 are connected to a remotely located utilization device 24 by means of a two wire transmission line 26. Utilization device 24 is preferably a sophisticated data processing system having inventory control programming, periodic report printouts and so forth capable of connection to plural combined magnetostrictive liquid level detector and plural location temperature detector devices 10.

Figure 2:
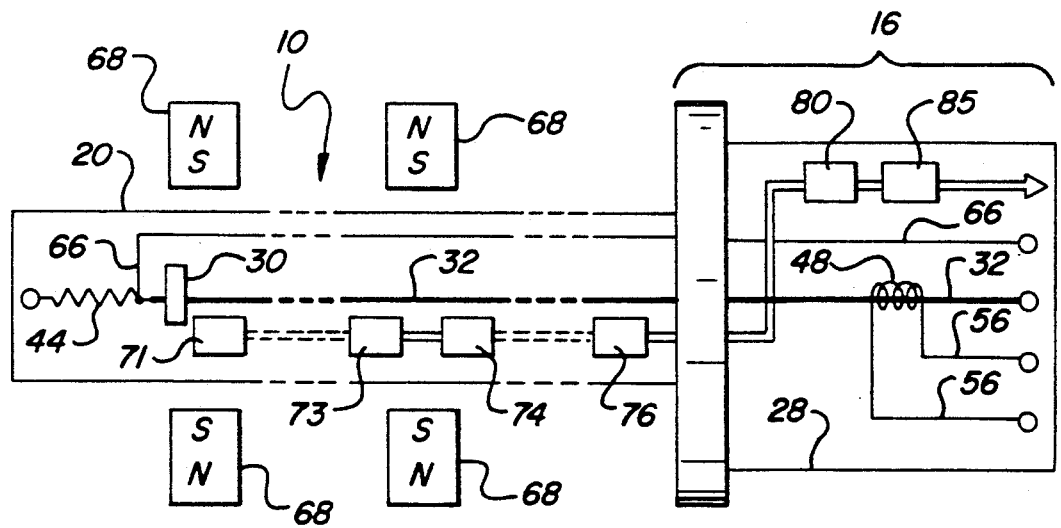
FIG. 2 is a schematic view of the probe portion of the detector of FIG. 1.

FIG. 2 illustrates in schematic form details of the mechanical and electro-mechanical components of device 10. Head 16 is illustrated with cap 18 removed. A base plate 28 is connected in a centered position to accommodate certain electronic components hereinafter described and to provide a structure for the mounting of a magnetostrictive wire 32. Magnetostrictive wire 32 is preferably formed of nickel/iron alloy; a material known as Nispan C is suitable. Wire 32 runs straight through the center of tube 20 and is secured at the head end by solder to a terminal on an insulative pad (not shown) which is secured to base plate 28. Wire 32 extends through a hollow center of head 16 and, as previously mentioned, through the center of tube 20 along substantially the entire length thereof. At the foot end wire 32 is secured by means of a tension spring 44 to the foot end of tube 20. A reflection collar 30 fastened to the wire near the spring 44 causes a mass discontinuity which serves to reflect torsional strain arriving at the collar back toward the head 16. Wire 32 is held in spaced relationship relative to the interior walls of tube 20 by means of rubber spacers (not shown) which may occur at regular or irregular intervals along the entire length of tube 20. There is essentially no limit on the length of tube 20; i.e., transducers of 40 feet in length are just as feasible as those of only a few feet in length. Spring 44 ensures proper tension in the wire so that it runs straight and parallel through tube 20. The foot end of wire 32 is electrically connected to a fine copper signal return wire 66 which passes in parallel spaced relationship to magnetostrictive wire 32 and through tube 20. The signal return wire 66 is connected to the electronics of device 10. For each of the floats 22, 23 a circular magnet 68 having radially arranged north and south poles is slidably disposed around tube 20 so that it may move along the length of tube 20 over the measurement range. A transducer 48 for issuing an electrical pulse when a torsional strain in the wire 32 reaches the head comprises a coil 50 wrapped around the wire near the head end and having leads 56. The magnetostrictive wire 32 has a small amount of residual magnetism as a result of the interrogation pulse applied to the wire and the magnetic flux lines link the windings of the coil 50. When an acoustical pulse in the wire reaches the head, it alters the magnetic permeability of the wire, thereby changing the magnetic flux field to induce an electrical pulse in the coil and a corresponding signal in its leads 56.

The magnetostrictive linear displacement detector operates as follows. An electrical interrotation pulse is applied to the series combination of wire 32 and a return which may be a wire 66 or an inner pipe (not shown). This pulse has a relatively short duration of a few microseconds. When this pulse reaches the position of a magnet 68, a localized torsional strain is imparted to the wire 32 by the interaction of this electrical pulse and the magnetic field of magnet 68. This localized torsional strain propagates along wire 32 toward both the head and the foot ends at a known rate. A typical propagation rate for devices used for liquid level detection is about 9 microseconds per inch. One torsional strain propagates directly toward the head end and another is reflected from the collar 30 and then travels toward the head end. Both strain pulses, in turn, are detected by transducer 48. A similar pair of strain pulses emanating from the location of the second magnet is likewise detected. For one pair of pulses, the interval between the pulses is a measure of the water level, and for the other pair of pulses, the corresponding interval is a measure of the product level.

FIG. 2 illustrates temperature dependent resistors 71 to 76 and temperature independent reference resistors 80 and 85. Temperature dependent resistors 71 to 76 are disposed at spaced intervals along the interior of tube 20 and are exposed to the local temperatures of the liquid within tank 12. Temperature dependent resistors 71 to 76 each have an electrical resistance which is dependent upon temperature in a known manner. Measurement of the resistance of one of temperature dependent resistors 71 to 76, such as by measuring the voltage drop induced by a fixed current, enables determination of the temperature in the vicinity of that resistor. Similar measurements of the reference resistors are also made.

Figure 3:
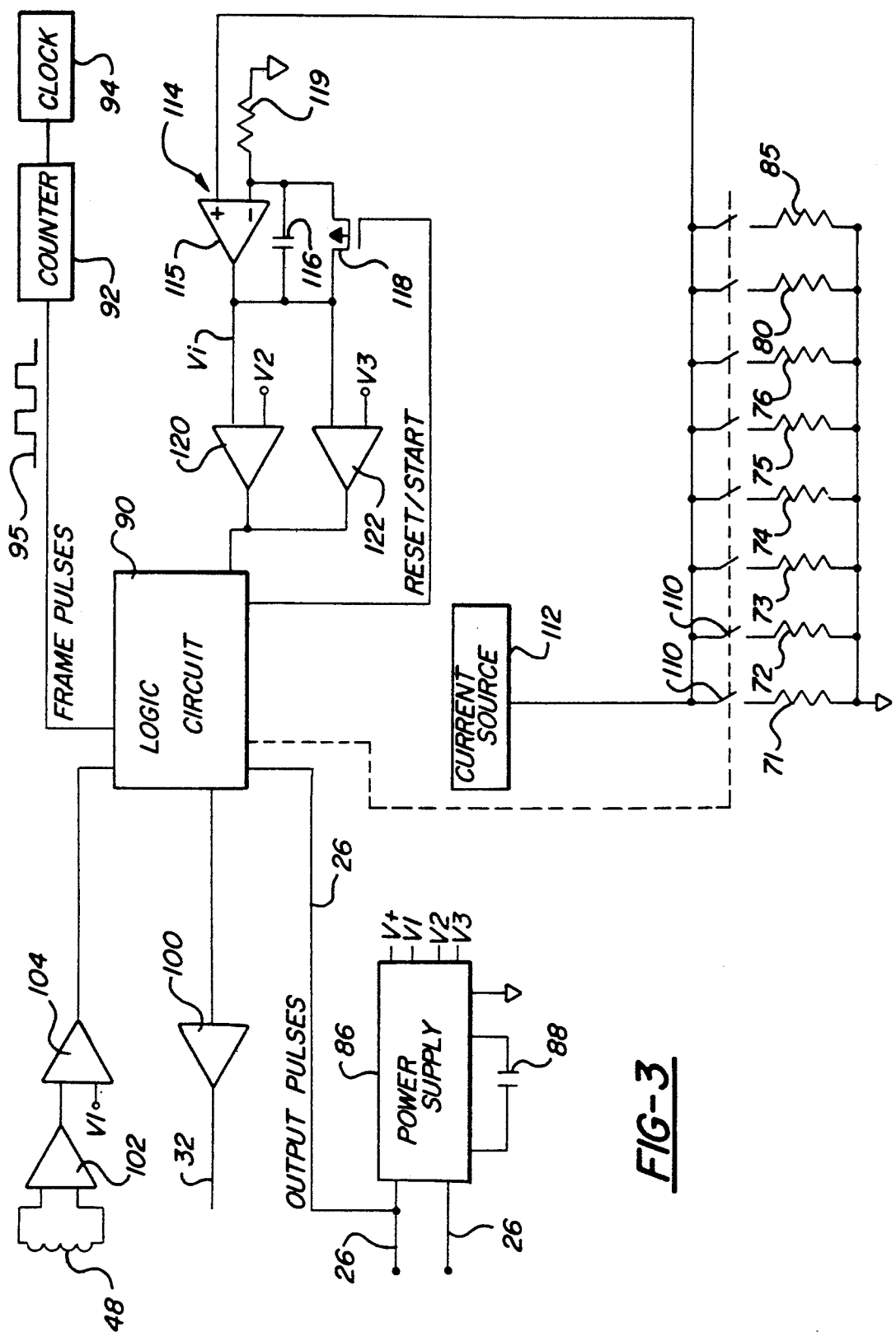
FIG. 3 is a schematic electronic circuit according to the invention for the detector of FIG. 1.

The electronic circuit for measuring the level and temperature parameters and transmitting the information in the desired format is shown in FIG. 3. Transmission lines 26 carry low level power to a power supply 86 which has a capacitor 88 for storing energy. The power supply provide voltage V+ to the various circuits elements and affords reference voltages V1, V2, and V3. A logic circuit 90 has a pulsed input of frame pulses provided by a counter 92 which counts pulses from a clock oscillator 94. The counter 92 outputs square wave pulses at frame intervals as required for the data transmission. Each rising edge 95 of the counter output defines the beginning of each frame as shown in FIG. 4. In the beginning of each frame, except for the first one, numbered 0, which is an empty frame or a pause, the logic circuit 90 generates an interrogation pulse 96 for level measurement or a reset/start pulse 98 for temperature measurement. By alternately measuring and transmitting level and temperature related data, the two types of data, when made, are interleaved in the transmission message. The interrogation pulse requires substantial power which is supplied from the capacitor 88 which recharges to supply the next interrogation pulse.

The interrogation pulse is coupled by a driver 100 to the magnetostrictive wire 32 in the probe. The resulting level pulses 106 developed in the probe are detected by the transducer 48, amplified by amplifier 102 and fed to one input of a comparator 104 which has a reference voltage V1 on the other input. This as the level pulses 106 sequentially exceed the level of reference V1, comparator output pulses 2-5 are fed to the logic circuit 90. FIG. 5 illustrates the series of pulses 106 received by the transducer 48 and detected by the comparator 104. The comparator output pulse 1 is a transient caused by the effect of the interrogation pulse on the coil 50 and may be ignored by the logic by means known in the art circuit. Pulse 2 corresponds to the direct pulse received from the product level and pulse 3 corresponds to the direct pulse received from the water level. Finally, the pulses 4 and 5 represent the reflected pulses received from the water level and the product level, respectively. The interval between pulses 2 and 5 is a measure of the product level and the interval between pulses 3 and 4 is a measure of the water level.

The level output pulses 2-5 are output on the transmission line 26. The pulse pairs are sorted according the current frame and the frame allocations. Frame 2 is allocated for water level data; accordingly, the pulses 3 and 4 are acquired and output during the time of frame 2. The other even numbered alternate frames 4-14 shown in FIG. 4 are allocated for product level data; accordingly pulses 2 and 5 are acquired and output during each such frame. By taking a product level measurement several times during each cycle of data frames, the resolution of level data is enhanced.

The temperature sensitive resistors 71-76 and the reference resistors 80 and 85 are each connected in series with an analog switch 110, and the resistor/switch combinations are connected in parallel between a current source 112 and ground. The analog switches are individually controlled by the logic circuit 90. The junction of the current source 112 and the resistor circuit is connected to the positive input of an integrator circuit 114 which includes an operational amplifier 115, an integrating capacitor 116 a FET transistor 118 across the capacitor 116 and an input resistor 119 between the negative input and ground., The integrator 114 output is coupled to window comparators 120 and 122 which are referenced to voltages V2 and V3, respectively. The comparator 120, 122 outputs are fed to the logic circuit 90. The reset/start signal, which is produced at the beginning of each odd numbered frame 1-15 of FIG. 4 controls the FET to discharge the capacitor 116 and this reset the integrator at the beginning of each of those frames. Also at the beginning of each of the frames, a designated one of the switches 110 is closed so that the current from the current source 112 flows through one of the resistors 71-85 and produces a voltage proportional to the one resistor and applies that voltage to the integrator input. The integrator 114 output voltage $V_1$ increases at a rate which is dependent on the input voltage. As illustrated in FIG. 6, when the integrator output $V_1$ passes through the level of V2 the window comparator 120 produces an output pulse A, and when it passes through voltage V3 the window comparator 122 produces a pulse B. These two pulses, A and B, are fed to the logic circuit and reproduced on the transmission line 26. As illustrated in FIG. 6, the separation of the two pulses A and B is a function of the integrator rate which, in turn, is dependent on the resistance being measured. Accordingly the spacing of the pulses in each pair carries the temperature data corresponding to the respective locations of resistors 71-76 and the reference values or resistors 80, 85.

The communication protocol, as shown in FIG. 4 comprises 16 frames or time periods, the first period, designated frame 0, is blank and serves as a synchronization frame so that the receiving circuit can recognize the beginning of the series of frames. The odd numbered frames 1-11 carry the pulses A and B which are spaced according to the resistors 71-76 which are respectively sampled in the odd numbered frames 1-11, and similarly the frames 13 and 15 contain the pulses A and B for reference resistors 80 and 85, respectively. Frame 2 contains the water level pulses 3 and 4, and even numbered frames 4-14 contain product level pulses 2 and 5 obtained by a separate measurement for each such frame. In every case, the pulse spacing represents the value of the parameter being measured. In practice, it has been found that for probes under 16 feet long, frames periods of 4.5 milliseconds are suitable. For longer probes correspondingly longer frame periods may be used.

In the utilization device 24 which receives the data messages, simple software can be used to sort the frames to identify the source of each pulse pair, and the pulse spacing is measured by a counter enabled during the pulse interval for counting clock pulses. If a 110 MHz clock is used, each count is equivalent to 0.0005 inch for the level measurements. In the case of the temperature measurements, the temperature is determined on the basis of the count for a given temperature pulse pair and the counts for the reference resistors. It is easy to verify the data integrity to guard against data corrupted by noise. Since each message has 15 frames and each frame contains two pulses, the total number of pulses per message is 30. The pulses for each message are counted and if the total is not equal to 30, the data is discarded and the measurement is repeated.

It will thus be seen that the system described herein provides a simple and accurate data transmission method. The data message is short since temperature measurement is occurring while the power capacitor 88 is recharging. The brief message allows a number of probes to be interrogated in a short period.

The embodiments of the invention in which an exclusive property or privilege is claimed are defined as follows:

1. In a combined temperature transducer and magnetostrictive displacement transducer for measuring the position of at least one displaceable magnet and the temperature at a plurality of sensors, the method of encoding position and temperature measurements comprising:
   making measurements by the displacement transducer and the temperature transducer in a prescribed order to obtain a sequence of measurement values;
   producing a pair of pulses for each measurement, the pulses in each pair being spaced in accordance with the corresponding measurement value; and
   transmitting data in a series of time frames, the first frame being synchronizing frame and subsequent frames comprise the pairs of pulses in the prescribed order, whereby the order of each frame in the series corresponds to the parameter being measured and the pulse spacing in each frame represents the measurement value.

2. The invention as defined in claim 1 wherein the step of making measurements in a prescribed order comprises alternately making position measurements and temperature related measurements.

3. The invention as defined in claim 1 wherein the displacement transducer is adapted to measure liquid levels in a vessel containing upper and lower liquids and has a first displaceable magnet floating at the interface of upper and lower liquids and a second displaceable magnet floating at the surface of the upper liquid, and wherein making measurements by the displacement transducer comprises the steps of:
   making one measurement of the position of the first displaceable magnet for each series of frames; and
   making a plurality of measurements of the position of the second displaceable magnet for each series of frames.

4. The invention as defined in claim 1 wherein the temperature transducer comprises a plurality of temperature dependent resistance elements disposed at various levels in a vessel and a plurality of temperature independent reference resistive elements, and the step of making measurements in a prescribed order includes alternately measuring magnet position and element resistance.

5. In a data collection system having a combined transducer assembly having a magnetostrictive transducer for making liquid level measurements and a temperature transducer for making temperature related measurements, and a power supply and data acquisition apparatus remote from the transducer assembly and coupled thereto by a transmission line for power and data transmission wherein the power supplied over the line is less than that required for exciting the magnetostrictive transducer, the method of making measurements and acquiring data comprising the steps of:
   alternately storing energy in the transducer assembly and discharging the stored energy to excite the magnetostrictive transducer to make successive level measurements;
   energizing the temperature transducer while energy is being stored to make a temperature or reference measurement between successive level measurements; and
   when each measurement is made transmitting data to the acquisition apparatus such that level data are interleaved with temperature and reference data.

6. The invention as defined in claim 5 wherein the measurements are made in a prescribed order; and
   the step of transmitting data includes transmitting a series of frames of data whereby the position of each frame in the series identifies the parameter being measured.

7. The invention as defined in claim 5 wherein the data for each measurement is transmitted as a pair of pulses having a spacing corresponding to the value of the measured parameter.

8. The invention as defined in claim 7 wherein the transmitting step comprises serially transmitting a fixed number of frames, the first frame being a synchronizing frame and subsequent frames comprise the pairs of pulses in the prescribed order, whereby the position of each frame in the series identifies the parameter being measured and the pulse spacing in each frame represents the value of the measured parameter.

9. The invention as defined in claim 8 including the step of verifying the data by counting the number of pulses per series and comparing the count with twice the number of subsequent frames.

10. The invention as defined in claim 5 wherein data for the measurements are serially transmitted in a fixed number of sequential time periods and each measurement is represented by a fixed number of pulses; and verifying the data transmission by counting the total number of pulses and comparing the total to the product of the fixed number of periods and the fixed number of pulses per period.

* * * * *